United States Patent
Lee

(10) Patent No.: US 8,101,464 B2
(45) Date of Patent: Jan. 24, 2012

(54) MICROELECTRONIC DEVICES AND METHODS FOR MANUFACTURING MICROELECTRONIC DEVICES

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 905 days.

(21) Appl. No.: 11/513,662

(22) Filed: Aug. 30, 2006

(65) Prior Publication Data

US 2008/0057621 A1    Mar. 6, 2008

(51) Int. Cl.
 H01L 21/00    (2006.01)
(52) U.S. Cl. .................... 438/112; 438/124
(58) Field of Classification Search .......... 438/111, 438/112, 123, 124
 See application file for complete search history.

(56) References Cited

U.S. PATENT DOCUMENTS

| | | | |
|---|---|---|---|
| 4,697,203 A * | 9/1987 | Sakai et al. ................ 257/681 |
| 6,221,697 B1 | 4/2001 | Su et al. |
| 6,242,815 B1 | 6/2001 | Hsu et al. |
| 6,821,819 B1 * | 11/2004 | Benavides et al. ........... 438/122 |
| 7,553,699 B2 * | 6/2009 | Lee ............................ 438/110 |
| 2002/0094606 A1 * | 7/2002 | Fukutomi et al. .......... 438/110 |
| 2004/0159462 A1 * | 8/2004 | Chung ....................... 174/259 |
| 2004/0245613 A1 * | 12/2004 | Lee .............................. 257/678 |
| 2005/0211979 A1 | 9/2005 | Ogawa et al. |
| 2005/0230821 A1 | 10/2005 | Kheng |
| 2006/0055010 A1 | 3/2006 | Kheng |

FOREIGN PATENT DOCUMENTS

EP    1564807 A2    8/2005

OTHER PUBLICATIONS

Search Report and Written Opinion issued Jan. 23, 2009 in Singapore Application No. 200605932-3.
Amagai, Masazumi et al., "Development of Chip Scale Packages (CSP) for Center Pad Devices," pp. 343-353, 1997 Electronic Components and Technology Conference, IEEE, 1997.

* cited by examiner

Primary Examiner — Charles Garber
Assistant Examiner — Reema Patel
(74) Attorney, Agent, or Firm — Perkins Coie LLP

(57) ABSTRACT

Microelectronic devices and methods for manufacturing microelectronic devices are disclosed herein. One such method includes forming a plurality of apertures in a substrate with the apertures arranged in an array, and, after forming the apertures, attaching the substrate to a lead frame having a plurality of pads with the apertures in the substrate aligned with corresponding pads in the lead frame. Another method includes providing a partially cured substrate, coupling the partially cured substrate to a plurality of leads, attaching a microelectronic die to the leads, and electrically connecting the microelectronic die to the leads.

21 Claims, 5 Drawing Sheets

_US 8,101,464 B2_

MICROELECTRONIC DEVICES AND METHODS FOR MANUFACTURING MICROELECTRONIC DEVICES

TECHNICAL FIELD

Embodiments of the present invention are related to microelectronic devices and methods for manufacturing microelectronic devices.

BACKGROUND

Microelectronic devices generally have a die (i.e., a chip) that includes integrated circuitry with a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, and etching). The dies typically include an array of very small bond-pads electrically coupled to the integrated circuitry. The bond-pads are external electrical contacts through which the supply voltage, signals, etc., are transmitted to and from the integrated circuitry. After forming the dies, the wafer is thinned by backgrinding, and then the dies are separated from one another (i.e., singulated) by dicing the wafer. Next, the dies are "packaged" to couple the bond-pads to a larger array of electrical terminals that can be more easily coupled to the various power supply lines, signal lines, and ground lines. Conventional processes for packaging dies include electrically coupling the bond-pads on the dies to an array of leads, ball-pads, or other types of electrical terminals, and then encapsulating the dies to protect them from environmental factors (e.g., moisture, particulates, static electricity, and physical impact).

Leaded packages, for example, include a die bonded to a lead frame with the die either seated on a die paddle or attached directly to the leads in a leads-over-chip arrangement. The bond-pads on the die are then wire-bonded to corresponding leads. The lead frame and die may then be encapsulated with a mold compound to form a packaged microelectronic device. In applications in which the leaded package includes a ball grid array, the casing encapsulating the lead frame includes openings at corresponding ball-pads on the leads. The openings are formed by contacting the ball-pads on the leads with corresponding projections in the mold during encapsulation. Next, a plurality of solder balls are placed in corresponding openings and attached to associated ball-pads. After connecting the solder balls, the packaged device can be attached to a printed circuit board or other external device.

One drawback of conventional methods for packaging a leaded device is that the projections in the mold may not contact the ball-pads and/or the mold compound may leak between the projections and the ball-pads. Accordingly, the encapsulated device may include mold flash over part or all of the individual ball-pads. It is difficult to remove the mold flash from the ball-pads without damaging the casing of the device. As a result, some conventional packaged leaded devices have mold flash between a portion of the solder ball and the ball-pad of one or more leads. In these devices, the mold flash may impair the structural and/or electrical connection between the solder ball and the ball-pad and render the devices defective.

Another drawback of conventional methods for packaging a leaded device is that the force of the mold compound flowing into the mold cavity may cause the flexible lead frame to bow or otherwise bend. In certain applications, the lead frame may be molded in a bowed configuration such that several of the solder balls cannot contact the printed circuit board during subsequent attachment, rendering the packaged device defective. Accordingly, there is a need to improve conventional processes for packaging dies attached to lead frames.

BRIEF DESCRIPTION OF THE DRAWINGS

FIGS. 1A-4 illustrate stages in a method for manufacturing a plurality of microelectronic devices in accordance with one embodiment of the invention.

FIG. 1A is a top plan view of a substrate for use in constructing a microelectronic device.

FIG. 2 is a schematic side cross-sectional view of a microelectronic device including the substrate and a lead frame attached to the substrate.

FIG. 3 is a schematic side cross-sectional view of the microelectronic device after attaching a microelectronic die to the lead frame with an adhesive.

FIG. 4 is a schematic side cross-sectional view of the microelectronic device after encasing the die and a portion of the lead frame.

DETAILED DESCRIPTION

Specific details of several embodiments of the invention are described below with reference to microelectronic devices including microelectronic dies attached to lead frames, but in other embodiments the microelectronic devices can include other components. For example, the microelectronic devices can include micromechanical components, data storage elements, optics, read/write components, or other features. The microelectronic dies can be SRAM, DRAM (e.g., DDR-SDRAM), flash-memory (e.g., NAND flash-memory), processors, and other types of devices. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1A-9.

Figure 1A:
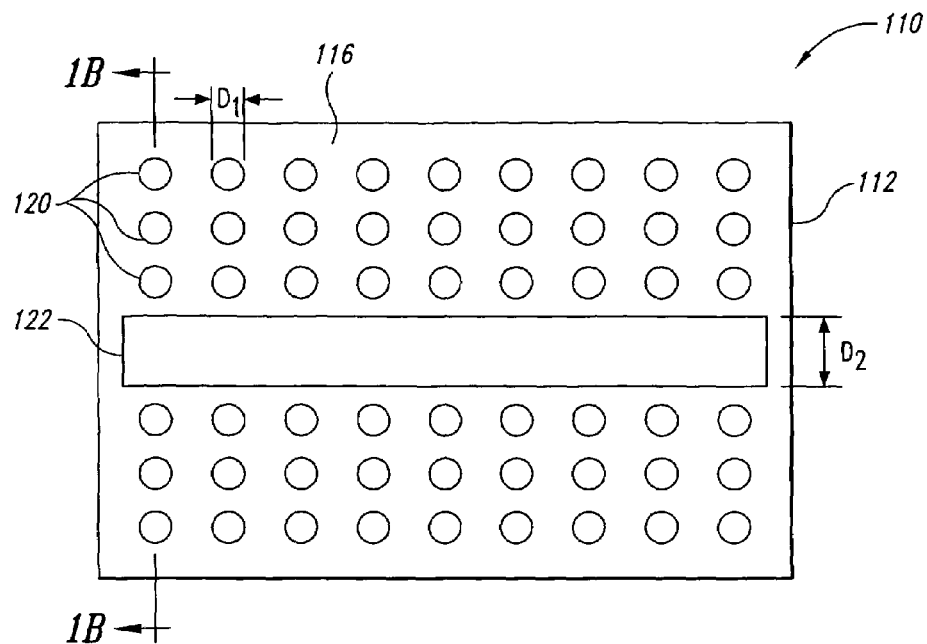
Figure 1B:
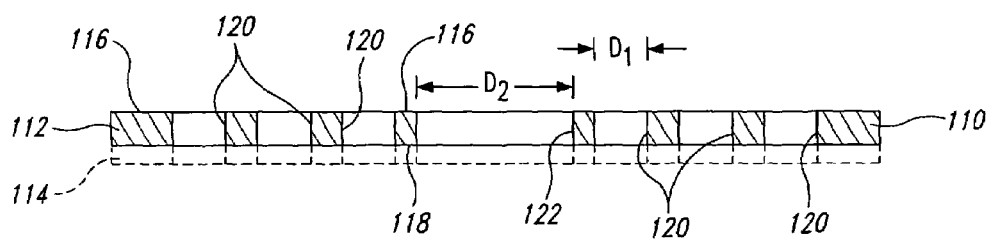
FIG. 1B is a schematic side cross-sectional view of the substrate taken substantially along the line 1B-1B of FIG. 1A.

FIGS. 1A-4 illustrate stages in a method for manufacturing microdevices or microelectronic devices in accordance with one embodiment of the invention. For example, FIG. 1A is a top plan view of a substrate 110, and FIG. 1B is a schematic side cross-sectional view of the substrate 110 taken substantially along the line 1B-1B of FIG. 1A. Referring to both FIGS. 1A and 1B, the illustrated substrate 110 includes a first surface 116, a second surface 118 (FIG. 1B) opposite the first surface 116, a plurality of apertures 120 extending between the first and second surfaces 116 and 118, and a slot 122 extending between the first and second surfaces 116 and 118. The illustrated apertures 120 are through holes arranged in a pattern corresponding to a ball grid array. However, in other embodiments, the apertures 120 can be arranged in other patterns. In either case, the individual apertures 120 have a diameter $D_1$ sized to receive an interconnect element (e.g., a solder ball). The illustrated slot 122 is positioned between two groups of apertures 120 and extends nearly the entire length of the substrate 110. The slot 122 has a width $D_2$ and is sized and positioned to be aligned with an array of terminals on a die that is subsequently attached to the substrate 110. The slot 122 and/or the apertures 120 can be formed by laser drilling, punching, routing, etching, or other suitable processes. In several embodiments, for example, the apertures 120 are not formed by photolithography. In additional embodiments, such as the embodiment described below with reference to FIG. 5, the substrate 110 may not include the slot 122.

The illustrated substrate 110 further includes a dielectric layer 112 with a partially cured material (e.g., B-stage material) for subsequently attaching the substrate 110 to a lead frame. For example, the dielectric layer 112 can be a pre-preg material with woven fiber cloth embedded in a B-stage resin. Suitable substrates 110 include Product No. MCF-6000E manufactured by Hitachi Chemical Co. America, Ltd., of Cupertino, Calif. In other embodiments, the substrate 110 can be a flex film or other member with unimpregnated resin. In additional embodiments, such as the embodiment described below with reference to FIG. 6, the substrate 110 may further include a conductive layer 114 (shown in broken lines) formed on the dielectric layer 112. In other embodiments, the dielectric layer 112 can include a fully cured material.

Figure 2:
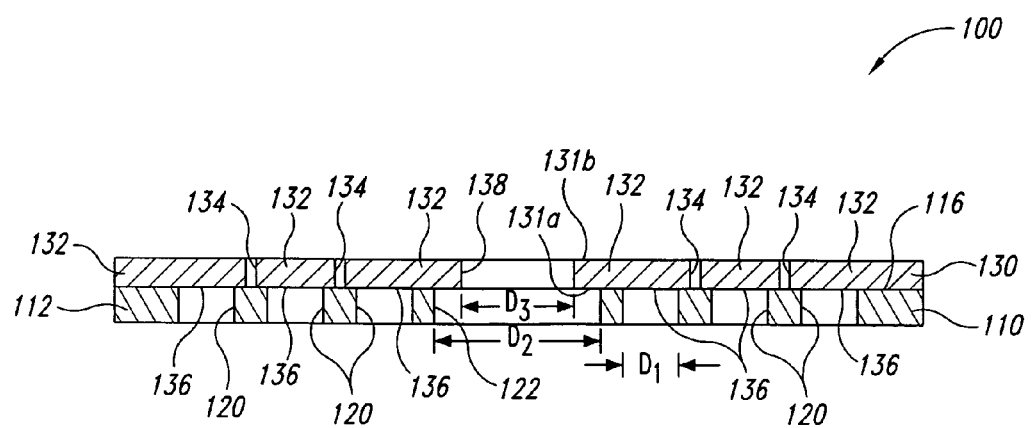

FIG. 2 is a schematic side cross-sectional view of a microelectronic device 100 including the substrate 110 and a lead frame 130 attached to the substrate 110. The lead frame 130 includes a first surface 131a attached to the first surface 116 of the substrate 110, a second surface 131b opposite the first surface 131a, a plurality of leads 132 spaced apart by gaps 134, and a slot 138 extending between the first and second surfaces 131a-b. The individual leads 132 include a pad 136 to which an interconnect element (e.g., solder ball) can be attached. The pads 136 are aligned with corresponding apertures 120 in the substrate 110, and have a diameter that can be greater than, less than, or approximately equal to the diameter $D_1$ of the individual apertures 120. The pads 136 may also have a surface finish (e.g., Ni/Au) for facilitating connection of the interconnect elements. The illustrated slot 138 is generally aligned with the slot 122 in the substrate 110, and has a width $D_3$ less than the width $D_2$ of the slot 122. As a result, the first surface 131a of the lead frame 130 is exposed at the slot 122 of the substrate 110.

In the illustrated embodiment, the lead frame 130 is attached to the substrate 110 without an adhesive positioned between the first surface 131a of the lead frame 130 and the first surface 116 of the substrate 110. Rather, the adhesive properties of the partially cured material in the dielectric layer 112 enable the lead frame 130 to remain attached to the substrate 110. After attaching the substrate 110 to the lead frame 130, the microelectronic device 100 can be heated to fully cure the partially cured material in the dielectric layer 112 and ensure that the substrate 110 remains connected to the lead frame 130. However, in other embodiments, such as embodiments in which the dielectric layer 112 does not include a partially cured material, the lead frame 130 can be attached to the substrate 110 with an adhesive. In these embodiments, the microelectronic device 100 may not be heated after attaching the substrate 110 to the lead frame 130.

Figure 3:
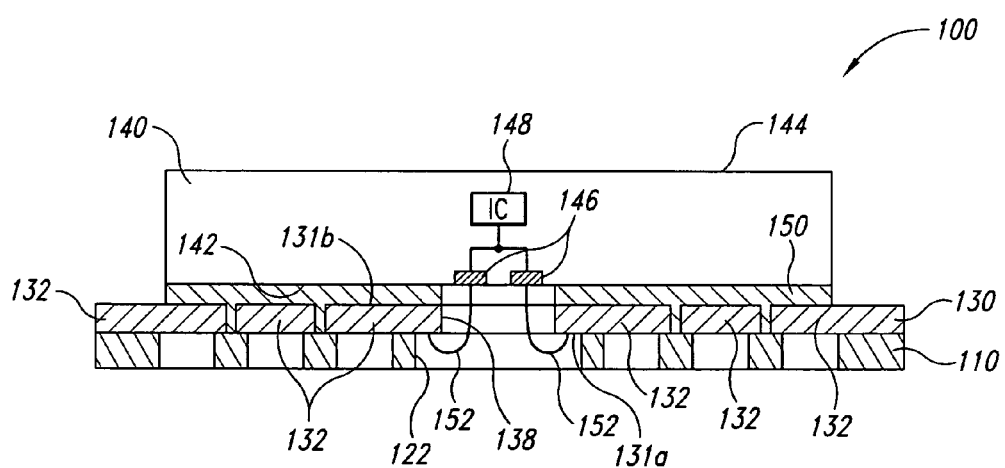

FIG. 3 is a schematic side cross-sectional view of the microelectronic device 100 after attaching a microelectronic die 140 to the lead frame 130 with an adhesive 150. The die 140 includes an active side 142, a backside 144 opposite the active side 142, a plurality of terminals 146 (e.g., bond-pads) arranged in an array on the active side 142, and an integrated circuit 148 (shown schematically) operably coupled to the terminals 146. In the illustrated microelectronic device 100, the active side 142 of the die 140 faces the second surface 131b of the lead frame 130, and the terminals 146 are aligned with the slots 122 and 138 in the substrate 110 and the lead frame 130, respectively. After attaching the die 140 to the lead frame 130, the terminals 146 on the die 140 can be electrically connected to corresponding leads 132. Specifically, a plurality of wire-bonds 152 are formed between the terminals 146 and the inner portion of the individual leads 132.

Figure 4:
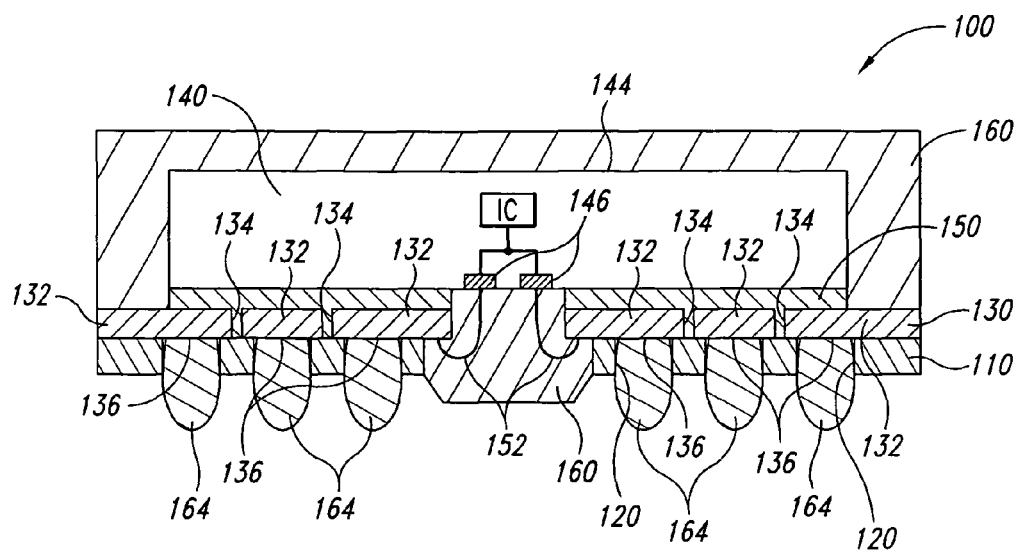

FIG. 4 is a schematic side cross-sectional view of the microelectronic device 100 after encasing the die 140 and a portion of the lead frame 130. After coupling the die 140 to the lead frame 130, the device 100 can be placed in a molding apparatus to form a casing 160 that encapsulates the die 140, a portion of the lead frame 130, and the wire-bonds 152. Although the illustrated casing 160 covers the entire backside 144 of the die 140, in other embodiments the backside 144 of the die 140 can be at least partially exposed.

After molding, a plurality of electrically conductive interconnect elements 164 (e.g., solder balls) are formed on corresponding pads 136 of the lead frame 130 and received in associated apertures 120 of the substrate 110. The interconnect elements 164 project from the substrate 110 and are arranged in an array for connection to a printed circuit board or other external member. The interconnect elements 164 are electrically coupled to corresponding terminals 146 on the die 140 and form the external contacts for the microelectronic device 100.

In one embodiment, a microelectronic device 100 includes a substrate 110 having a plurality of apertures 120 arranged in an array and a plurality of leads 132 attached to the substrate 110. The individual leads 132 have a pad 136 aligned with a corresponding aperture 120 in the substrate 110. The pad 136 is configured to receive a solder ball or other interconnect element. The substrate 110 can be attached to the leads 132 without an adhesive positioned between the substrate 110 and the leads 132.

In another embodiment, a microelectronic device 100 includes a partially cured substrate 110, a lead frame 130 connected to the partially cured substrate 110, and a microelectronic die 140 attached to the lead frame 130 and/or the partially cured substrate 110.

In one embodiment, a method for manufacturing a microelectronic device 100 includes forming a plurality of apertures 120 in a substrate 110 with the apertures 120 arranged in an array. The method further includes, after forming the apertures 120, attaching the substrate 110 to a lead frame 130 having a plurality of pads 136 with the apertures 120 in the substrate 110 aligned with corresponding pads 136 on the lead frame 130.

In another embodiment, a method of manufacturing a microelectronic device includes providing a partially cured substrate 110 and forming a plurality of through holes 120 in the partially cured substrate 110. The through holes 120 are arranged in an array corresponding to an array of pads on a lead frame.

In yet another embodiment, a method for manufacturing a microelectronic device 100 includes providing a partially cured substrate 110, coupling the substrate 110 to a plurality of leads 132, attaching a microelectronic die 140 to the leads 132 and/or the partially cured substrate, and electrically connecting the microelectronic die 140 to the leads 132. The partially cured substrate 110 can be completely cured after coupling the substrate 110 to the leads 132.

An embodiment of the microelectronic device 100 illustrated in FIGS. 1A-4 (and described above) includes a substrate 110 that is aligned with and covers the gaps 134 between adjacent leads 132. This arrangement can inhibit the mold compound from flowing through the gaps 134 and onto the pads 136 of the leads 132 during molding. The substrate 110 further inhibits the mold compound from flowing outward from the slots 122 and 138 and onto the pads 136 of the leads 132. As a result, the mold compound is expected to not cover the pads 136 and not impair the structural and electrical connection between the interconnect elements 164 and the pads 136 on the microelectronic device 100. The improved structural and electrical connection between the interconnect elements 164 and the pads 136 is further expect to increase the yield of the microelectronic devices 100.

In the illustrated embodiment of the microelectronic device 100 shown in FIGS. 1A-4 and described above, the substrate 110 can strengthen the lead frame 130 such that the lead frame 130 is expected to not bend or bow significantly during molding. As a result, the lead frame 130 is expected to be configured such that all of the interconnect elements 164 can contact the printed circuit board or other external members during subsequent attachment. Increasing the rigidity or robustness of the lead frame 130 can increase the yield of the microelectronic devices 100.

In the embodiment of the microelectronic device 100 illustrated in FIGS. 1A-4, the substrate 110 electrically insulates the leads 132 from the printed circuit board or other external members. As a result, the microelectronic device 100 need not require a solder mask or other insulator to be placed on the leads 132 to insulate the leads 132 and to prevent accidental contact and possible shorting between the leads 132 and external devices.

Figure 5:
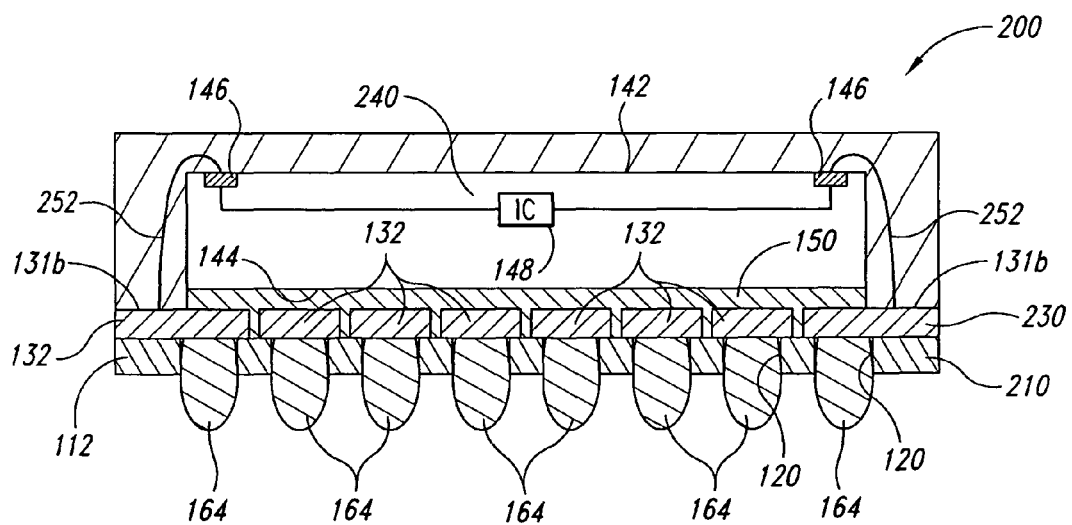
FIG. 5 is a schematic side cross-sectional view of a microelectronic device configured in accordance with another embodiment of the invention.

FIG. 5 is a schematic side cross-sectional view of a microelectronic device 200 configured in accordance with another embodiment of the invention. The illustrated microelectronic device 200 is generally similar to the microelectronic device 100 described above with reference to FIGS. 1A-4. For example, the microelectronic device 200 includes a substrate 210, a lead frame 230 attached to the substrate 210, and a microelectronic die 240 coupled to the lead frame 230. In the illustrated microelectronic device 200, however, the substrate 210 and the lead frame 230 do not include slots. Rather, the dielectric layer 112 and the apertures 120 extend across the substrate 210, and the arrangement of leads 132 extends across the lead frame 230. Moreover, in the illustrated microelectronic device 200, the backside 144 of the die 240 is attached to the lead frame 230, the active side 142 of the die 240 faces away from the lead frame 230, and the terminals 146 on the die 240 are positioned at a perimeter portion of the active side 142. As a result, the microelectronic device 200 includes a plurality of wire-bonds 252 that electrically couple the terminals 146 to the second surface 131b of the leads 132. In additional embodiments, the microelectronic device 200 can have a different configuration.

Figure 6:
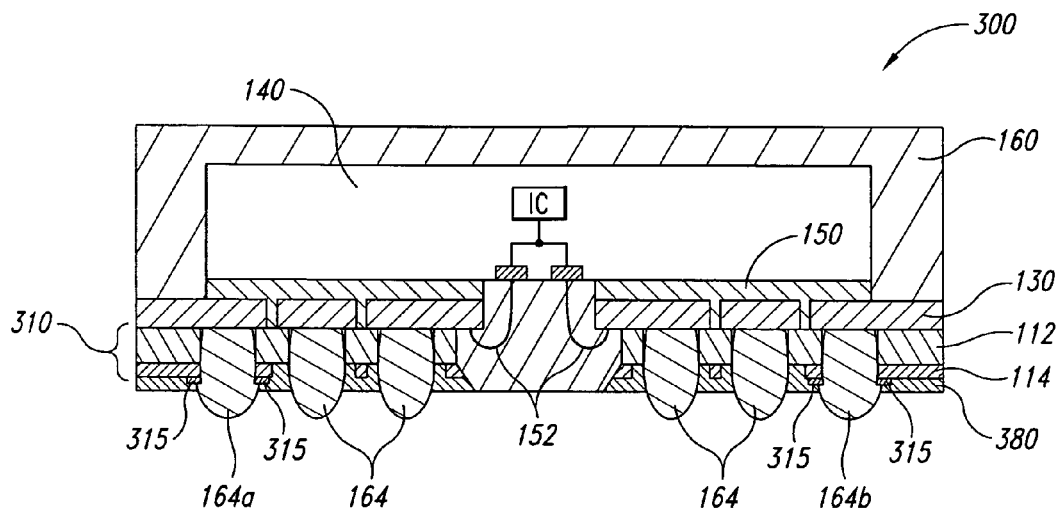
FIG. 6 is a schematic side cross-sectional view of a microelectronic device configured in accordance with another embodiment of the invention.

FIG. 6 is a schematic side cross-sectional view of a microelectronic device 300 configured in accordance with another embodiment of the invention. The illustrated microelectronic device 300 is generally similar to the microelectronic device 100 described above with reference to FIGS. 1A-4. For example, the microelectronic device 300 includes a substrate 310, a lead frame 130 attached to the substrate 310, and a microelectronic die 140 attached to the lead frame 130. The illustrated substrate 310, however, includes a dielectric layer 112 and a conductive layer 114 on the dielectric layer 112. For example, the substrate 310 can be a pre-preg material, and the conductive layer 114 can be a single copper cladded foil on the pre-preg material. The dielectric layer 112 is attached to the lead frame 130, and the conductive layer 114 can be electrically coupled to one or more interconnect elements 164. For example, in the illustrated embodiment, a first section of the conductive layer 114 is electrically coupled to a first interconnect element 164a, and a second section of the conductive layer 114 is electrically coupled to a second interconnect element 164b. As such, the first and second interconnect elements 164a-b connect the lead frame 130 to the conductive layer 114. In the illustrated embodiment, the microelectronic device 300 further includes a plurality of land pads 315 formed on the conductive layer 114 adjacent to the first and second interconnect elements 164a-b. The land pads 315 facilitate attachment of the first and second interconnect elements 164a-b to the conductive layer 114 and can be composed of Ni/Au or other suitable materials. The conductive layer 114 can accordingly function as a ground plane, heat sink, or other device to improve the electrical and/or thermal performance of the microelectronic device 300. Suitable substrates 310 include resin-coated copper (RCC) materials manufactured by Hitachi Chemical Co. America, Ltd., of Cupertino, Calif.

The illustrated microelectronic device 300 further includes a dielectric layer 380 (e.g., a solder mask) covering the conductive layer 114 of the substrate 310 and disposed in the gaps between the conductive layer 114 and corresponding interconnect elements 164. The dielectric layer 380 electrically insulates the conductive layer 114 from external devices. In other embodiments, the microelectronic device 310 may not include the dielectric layer 380 and/or can have other configurations.

Figure 7:
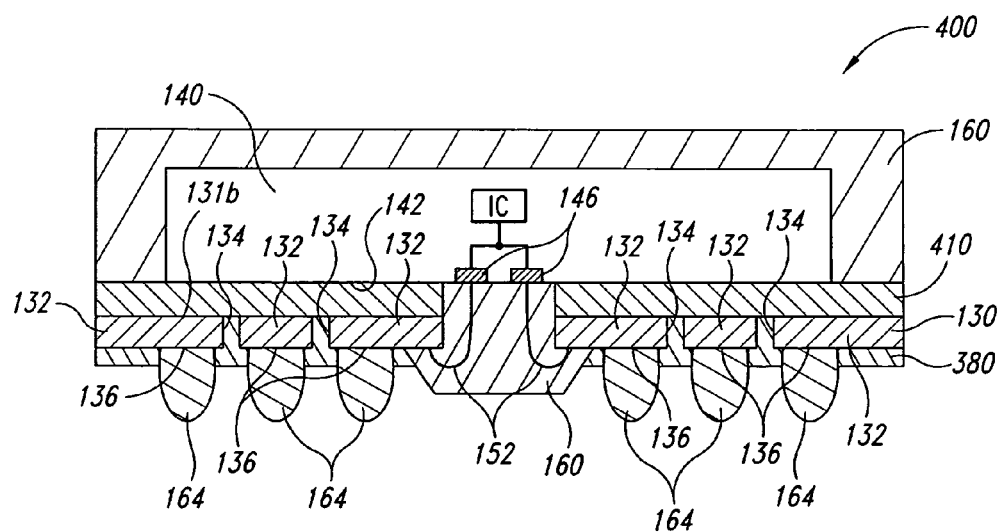
FIG. 7 is a schematic side cross-sectional view of a microelectronic device configured in accordance with another embodiment of the invention.

FIG. 7 is a schematic side cross-sectional view of a microelectronic device 400 configured in accordance with another embodiment of the invention. The illustrated microelectronic device 400 is generally similar to the microelectronic device 100 described above with reference to FIGS. 1A-4. For example, the microelectronic device 400 includes a substrate 410, a lead frame 130, and a microelectronic die 140. In the illustrated microelectronic device 400, however, the substrate 410 is positioned between the lead frame 130 and the die 140 and does not include apertures aligned with corresponding pads 136 in the lead frame 130. The substrate 410 accordingly functions as an adhesive that attaches the second surface 131b of the lead frame 130 to the active side 142 of the die 140. After coupling the die 140 to the lead frame 130, the partially cured substrate 410 can be completely cured. The illustrated microelectronic device 400 further includes a dielectric layer 380 (e.g., a solder mask) covering the lead frame 130 and disposed in the gaps 134 between adjacent leads 132. As such, the dielectric layer 380 electrically insulates the lead frame 130 from external devices.

Figure 8:
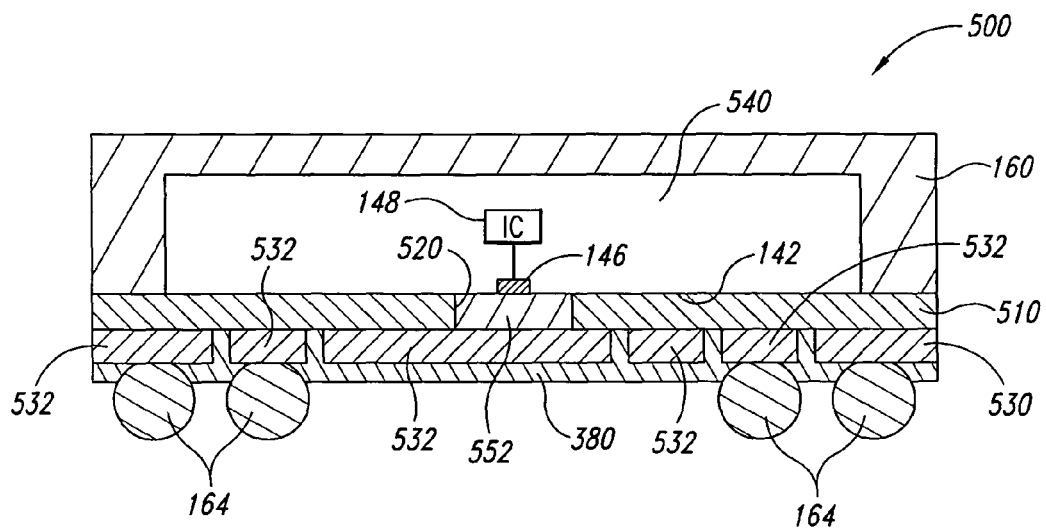
FIG. 8 is a schematic side cross-sectional view of a microelectronic device configured in accordance with another embodiment of the invention.

FIG. 8 is a schematic side cross-sectional view of a microelectronic device 500 configured in accordance with another embodiment of the invention. The illustrated microelectronic device 500 is generally similar to the microelectronic device 400 described above with reference to FIG. 7. For example, the microelectronic device 500 includes a substrate 510, a lead frame 530 attached to the substrate 510, and a microelectronic die 540 attached to the substrate 510. The illustrated microelectronic device 500, however, does not include wire-bonds electrically coupling the die 540 to the lead frame 530.

Rather, the microelectronic device 500 includes a plurality of first interconnect elements 552 (only one shown in FIG. 8) extending between the terminals 146 on the die 540 and corresponding leads 532. The first interconnect elements 552 can be reflowed bumps or other suitable conductive members. The illustrated substrate 510 includes a plurality of apertures 520 (only one shown in FIG. 8) aligned with corresponding terminals 146 and sized to receive associated first interconnect elements 552. In the illustrated embodiment, the substrate 510 accordingly functions as an underfill structure by electrically insulating and providing structural support to the first interconnect elements 552.

Figure 9:
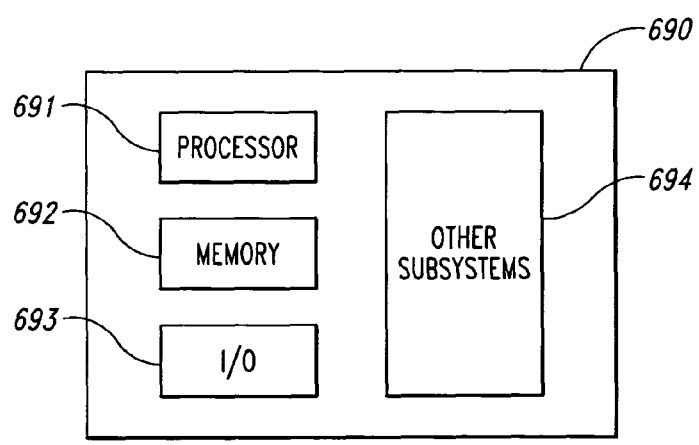
FIG. 9 is a schematic illustration of a system in which the microelectronic devices may be incorporated.

Any one of the microelectronic devices 100, 200, 300, 400, and/or 500 described above with reference to FIGS. 1A-8 can be incorporated into any of a myriad of larger and/or more complex systems 690, a representative one of which is shown schematically in FIG. 9. The system 690 can include a processor 691, a memory 692 (e.g., SRAM, DRAM, Flash, and/or other memory device), input/output devices 693, and/or other subsystems or components 694. Microelectronic devices may be included in any of the components shown in FIG. 9. The resulting system 690 can perform any of a wide variety of computing, processing, storage, sensor and/or other functions. Accordingly, representative systems 690 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini computers. Other representative systems 690 include cameras, light or other radiation sensors, servers and associated server subsystems, display devices, and/or memory devices. Components of the system 690 may be housed in a single unit or distributed over multiple, interconnected units, e.g., through a communications network. Components can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the spirit and scope of the invention. For example, the lead frame may also include a die pad attached to the die. Further, many of the elements of one embodiment can be combined with other embodiments in addition to or in lieu of the elements of the other embodiments. Accordingly, the invention is not limited except as by the appended claims.

I claim:

1. A method for manufacturing a microdevice, the method comprising:
    providing a lead frame including a plurality of leads, adjacent leads being spaced apart by gaps, and individual leads including a pad;
    forming a plurality of apertures in a partially cured substrate with the apertures arranged in an array;
    after forming the apertures, attaching the partially cured substrate to the lead frame with the substrate covering at least some of the gaps and the apertures in the substrate being aligned with corresponding pads;
    completely curing the partially cured substrate after attaching the substrate to the lead frame;
    coupling a microelectronic die to the lead frame with the lead frame positioned between the die and the substrate;
    electrically connecting the die to the lead frame;
    encasing at least a portion of the die and a portion of the lead frame; and
    attaching a plurality of interconnect elements to corresponding pads with the interconnect elements received in associated apertures.

2. A method for manufacturing a microdevice, the method comprising:
    providing a lead frame including a plurality of leads, adjacent leads being spaced apart by gaps, and individual leads including a pad;
    forming a plurality of apertures in a substrate with the apertures arranged in an array, forming the apertures in the substrate includes constructing the apertures in a partially cured material; and
    after forming the apertures, attaching the substrate to the lead frame with the substrate covering at least some of the gaps and the apertures in the substrate being aligned with corresponding pads.

3. The method of claim 2 wherein forming the apertures in the substrate comprises constructing a plurality of through holes in the substrate.

4. The method of claim 2 wherein attaching the substrate to the lead frame comprises coupling the substrate to the lead frame without an adhesive positioned between the substrate and the lead frame.

5. The method of claim 2, further comprising coupling a microelectronic die to the lead frame with the lead frame positioned between the die and the substrate.

6. The method of claim 2 wherein:
    the substrate further comprises a dielectric layer and a conductive layer on the dielectric layer;
    forming the apertures in the substrate comprises constructing through holes in the conductive and dielectric layers; and
    attaching the substrate to the lead frame comprises coupling the substrate to the lead frame with the dielectric layer positioned between the conductive layer and the lead frame.

7. A method for manufacturing a microelectronic device, the method comprising:
    providing a plurality of leads with adjacent leads being spaced apart by a gap;
    providing a partially cured substrate;
    forming a plurality of apertures in the partially cured substrate;
    coupling the partially cured substrate to the plurality of leads after forming the plurality of apertures in the partially cured substrate;
    attaching a microelectronic die to at least one of the leads or the partially cured supstrate; and
    electrically connecting the microelectronic die the leads.

8. The method of claim 7, further comprising completely curing the substrate after coupling the substrate to the leads.

9. The method of claim 7, further comprising encasing at least a portion of the die and a portion of the leads after coupling the substrate to the leads.

10. The method of claim 7 wherein:
    the microelectronic die comprises an active side, a backside, a plurality of terminals on the active side, and an integrated circuit operably coupled to the terminals;
    attaching the die to the leads comprises coupling the active side of the die to the leads; and
    electrically connecting the die to the leads comprises wirebonding the terminals to corresponding leads.

11. The method of claim 7 wherein:
the microelectronic die comprises an active side, a backside, a plurality of terminals on the active side, and an integrated circuit operably coupled to the terminals;
attaching the die to the leads comprises coupling the backside of the die to the leads; and
electrically connecting the die to the leads comprises wirebonding the terminals to corresponding leads.

12. The method of claim 7 wherein attaching the microelectronic die to at least one of the leads or the partially cured substrate comprises connecting the die to the leads with the leads positioned at least partially between the die and the partially cured substrate.

13. The method of claim 7 wherein attaching the microelectronic die to at least one of the leads or the partially cured substrate comprises connecting the die to the partially cured substrate with at least a portion of the partially cured substrate positioned between the die and the leads.

14. A method for manufacturing a microelectronic device, the method comprising:
providing a plurality of leads with adjacent leads being spaced apart by a gap, individual leads include a pad;
providing a partially cured substrate, the partially cured substrate includes a plurality of apertures;
coupling the partially cured substrate to the plurality of leads, coupling the substrate to the plurality of leads includes attaching the substrate to the leads with the apertures aligned with corresponding pads;
attaching a microelectronic die to at least one of the leads or the partially cured substrate; and
electrically connecting the microelectronic die to the leads;
encasing at least a portion of the die and a portion of the leads; and
attaching a plurality of interconnect elements to corresponding pads with the interconnect elements received in associated apertures.

15. A for manufacturing a microelectronic device, the method comprising:
providing a plurality of leads with adjacent leads being spaced apart by a gap;
providing a plurality cured substrate;
coupling the partially cured substrate to the plurality of leads;
attaching a microelectronic die to at least one of the leads or the partially cured substrate; and
electrically connecting the microelectronic die to the leads;
wherein attaching the microelectronic die to at least one of the leads or the partially cured substrate includes connecting the die to the partially cured substrate with a plurality of apertures in the substrate aligned with corresponding terminals on the die.

16. A method for manufacturing a microelectronic device, the method comprising:
providing a lead frame including an array of pads with adjacent pads being spaced apart by a gap;
providing a partially cured substrate; and
forming a plurality of through holes in the partially cured substrate with the holes arranged in an array corresponding to the array of pads on the lead frame.

17. The method of claim 15 wherein forming the through holes comprises drilling the through holes in the partially cured substrate.

18. The method of claim 16 wherein forming the through holes comprises punching the partially cured substrate to construct the through holes.

19. The method of claim 16 wherein forming the through holes comprises routing the partially cured substrate.

20. The method of claim 16 wherein forming the through holes comprises constructing the through holes without photolithography.

21. The method of claim 16 wherein providing the partially cured substrate comprises providing a pre-preg material.

* * * * *

UNITED STATES PATENT AND TRADEMARK OFFICE
CERTIFICATE OF CORRECTION

| | | |
|---|---|---|
| PATENT NO. | : 8,101,464 B2 | Page 1 of 1 |
| APPLICATION NO. | : 11/513662 | |
| DATED | : January 24, 2012 | |
| INVENTOR(S) | : Teck Kheng Lee | |

It is certified that error appears in the above-identified patent and that said Letters Patent is hereby corrected as shown below:

In column 8, line 52, in Claim 7, delete "supstrate;" and insert -- substrate; --, therefor.

In column 8, line 53, in Claim 7, delete "die the" and insert -- die to the --, therefor.

In column 10, line 1, in Claim 15, after "A" insert -- method --.

In column 10, line 5, in Claim 15, delete "plurality" and insert -- partially --, therefor.

In column 10, line 24, in Claim 17, delete "15" and insert -- 16 --, therefor.

Signed and Sealed this
Twenty-seventh Day of March, 2012

David J. Kappos
*Director of the United States Patent and Trademark Office*